United States Patent
Kataigi et al.

(10) Patent No.: US 9,583,372 B2
(45) Date of Patent: Feb. 28, 2017

(54) STRUCTURE FOR JOINING CERAMIC PLATE TO METAL CYLINDRICAL MEMBER

(71) Applicant: NGK INSULATORS, LTD., Nagoya (JP)

(72) Inventors: Takashi Kataigi, Handa (JP); Takashi Tanimura, Tokyo (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 14/964,977

(22) Filed: Dec. 10, 2015

(65) Prior Publication Data
US 2016/0099164 A1 Apr. 7, 2016

Related U.S. Application Data

(63) Continuation of application No. PCT/JP2015/056892, filed on Mar. 10, 2015.

(30) Foreign Application Priority Data

Mar. 27, 2014 (JP) .................................. 2014-065541

(51) Int. Cl.
*B23K 31/02* (2006.01)
*H01L 21/683* (2006.01)
(Continued)

(52) U.S. Cl.
CPC ........ *H01L 21/6833* (2013.01); *B23K 1/0008* (2013.01); *B23K 1/19* (2013.01);
(Continued)

(58) Field of Classification Search
CPC .... B23K 1/0008; B23K 2203/18; B23K 1/19; B23K 3/00; B23K 2203/52;
(Continued)

(56) References Cited

U.S. PATENT DOCUMENTS 3,772,766 A * 11/1973 Ebendt .................. C04B 37/021
228/122.1
3,950,836 A * 4/1976 Friedel .................. C04B 37/026
228/185
(Continued)

FOREIGN PATENT DOCUMENTS

JP  08-268770 A1  10/1996
JP  09-251991 A1  9/1997
(Continued)

OTHER PUBLICATIONS

Korean Office Action, Korean Application No. 10-2015-7036810, dated Mar. 17, 2016 (5 pages).
(Continued)

*Primary Examiner* — Kiley Stoner
(74) *Attorney, Agent, or Firm* — Burr & Brown, PLLC

(57) ABSTRACT

A member for semiconductor manufacturing device includes a susceptor which is a ceramic plate formed of AlN and a gas introduction pipe which is joined to the susceptor. An annular pipe joining bank is provided at a position of the susceptor facing a flange of the gas introduction pipe. In addition, a pipe brazed part is formed between the flange and the pipe joining bank. The flange has a width of 3 mm or more and a thickness of from 0.5 to 2 mm. It is preferable that the height of the pipe joining bank be 0.5 mm or more, the edge of the bank facing the outer edge of the flange. be chamfered as designated by C0.3 or more or rounded as designated by R0.3 or more.

8 Claims, 5 Drawing Sheets

(51) Int. Cl.
*B23K 1/19* (2006.01)
*C04B 37/02* (2006.01)
*H01L 21/687* (2006.01)
*B23K 1/00* (2006.01)
*B23K 3/00* (2006.01)

(52) U.S. Cl.
CPC ............... *B23K 3/00* (2013.01); *C04B 37/02* (2013.01); *H01L 21/68785* (2013.01); *B23K 2203/18* (2013.01); *B23K 2203/52* (2015.10)

(58) Field of Classification Search
CPC ........ B23K 2201/04–2201/12; H01L 21/6833; H01L 21/68785; C04B 37/02
USPC ................. 228/49.5, 122.1–124.7, 245–262; 428/544–687, 34.1–36.92, 411.1–704
See application file for complete search history.

(56) References Cited

U.S. PATENT DOCUMENTS

| | | | | |
|---|---|---|---|---|
| 4,077,114 A * | 3/1978 | Sakuma | ............ | H01H 33/66207 218/130 |
| 4,381,472 A * | 4/1983 | Sakauchi | ................. | B23K 1/19 174/50.61 |
| 4,420,869 A * | 12/1983 | Erkan | ..................... | H01L 21/50 228/124.1 |
| 4,642,864 A * | 2/1987 | Metcalfe | ................ | B23K 35/24 165/4 |
| 4,682,269 A * | 7/1987 | Pitasi | ................... | H05K 1/0209 165/185 |
| 4,746,054 A * | 5/1988 | Moats | ..................... | B23K 1/18 227/122 |
| 4,955,522 A * | 9/1990 | Stuhler | ................. | C04B 37/026 228/124.1 |
| 5,042,847 A * | 8/1991 | Lasecki | ................. | C04B 37/026 228/124.5 |
| 5,076,484 A * | 12/1991 | Ito | .......................... | F01D 5/025 228/124.7 |
| 5,104,747 A * | 4/1992 | Makino | ................. | C04B 35/645 403/29 |
| 5,108,025 A * | 4/1992 | Kang | ..................... | C04B 37/026 228/124.7 |
| 5,364,010 A * | 11/1994 | Mizuhara | ............. | B23K 35/004 228/124.5 |
| 5,902,406 A | 5/1999 | Uchiyama et al. | | |
| 5,968,273 A * | 10/1999 | Kadomura | ............. | C23C 16/14 118/715 |
| 6,057,513 A * | 5/2000 | Ushikoshi | ........... | H01L 21/6833 174/260 |
| 6,221,511 B1 | 4/2001 | Sakuraba et al. | | |
| 6,297,549 B1 * | 10/2001 | Hiyoshi | ................ | H01L 25/072 257/502 |
| 6,436,545 B1 * | 8/2002 | Tanahashi | ............. | C04B 37/025 420/489 |
| 6,566,621 B1 * | 5/2003 | Makino | ................. | C04B 37/026 218/123 |
| 6,849,938 B2 * | 2/2005 | Ito | ..................... | H01L 21/67103 219/520 |
| 2004/0058186 A1 * | 3/2004 | Daulton | ............... | A61N 1/3605 428/621 |
| 2004/0218339 A1 * | 11/2004 | Nakamura | ........ | H01L 21/67109 361/234 |
| 2008/0045991 A1 * | 2/2008 | Mihalca | ............. | A61B 1/00096 606/176 |
| 2009/0130825 A1 * | 5/2009 | Nakamura | ........ | H01L 21/67103 438/478 |

FOREIGN PATENT DOCUMENTS

| | | | |
|---|---|---|---|
| JP | 10-195657 A1 | | 7/1998 |
| JP | 2000-219578 A1 | | 8/2000 |
| JP | 2001156162 A | * | 6/2001 |
| JP | 2002121083 A | * | 4/2002 |
| JP | 2003-300784 A1 | | 10/2003 |
| JP | 2004-297103 A1 | | 10/2004 |
| JP | 2005216641 A | * | 8/2005 |
| JP | 2005235576 A | * | 9/2005 |
| JP | 2006040766 A | * | 2/2006 |
| KR | 10-1998-0080073 A | | 11/1998 |

OTHER PUBLICATIONS

English Translation of International Preliminary Report on Patentability, International Application No. PCT/JP2015/056892, dated Oct. 6, 2016 (7 pages).

International Search Report and Written Opinion (Application No. PCT/JP2015/056892) dated Jun. 2, 2015 (with English translation).

* cited by examiner

STRUCTURE FOR JOINING CERAMIC PLATE TO METAL CYLINDRICAL MEMBER

BACKGROUND OF THE INVENTION

1. Field of the Invention

The present invention relates to a structure for joining a ceramic plate to a metal cylindrical member.

2. Description of the Related Art

An electrostatic chuck is used as a holding member that attracts a wafer and controls the temperature of the wafer during a semiconductor manufacturing process. Known examples of such an electrostatic chuck include an electrostatic chuck in which a metal gas introduction pipe is joined to a discoid ceramic plate having a gas introduction hole so as to supply an He gas or the like from a rear side to a wafer attracting surface of the ceramic plate, thereby improving thermal conductivity (for example, PTL 1).

Meanwhile, as a method of joining a ceramic plate to a metal gas introduction pipe, a brazing method is known. In this method, brazing is performed by filling a brazing filler material in a space between a ceramic plate 110 and a gas introduction pipe 120 and applying the brazing filler material to a region from a side surface of the gas introduction pipe 120 to a rear surface of an electrostatic chuck as illustrated in FIG. 7 (for example, PTL 2). After the brazing has been performed, the brazing filler material becomes a fillet-shaped brazed part 124. In this case, stress is produced between the ceramic plate 110 and the gas introduction pipe 120 due to the difference in thermal expansion between the ceramic plate 110 and the gas introduction pipe 120. In order to reduce the stress as much as possible, the gas introduction pipe 120 is formed of a metal having a thermal expansion coefficient close to that of the ceramic plate 110.

CITATION LIST

Patent Literature

PTL 1: JP 2004-297103 A
PTL 2: JP 2000-219578 A (FIG. 3)

SUMMARY OF THE INVENTION

However, with a structure for joining of FIG. 7, even when the gas introduction pipe 120 is formed of a metal having a thermal expansion coefficient close to that of the ceramic plate 110, a joint portion may be separated due to a heat cycle applied during use of the electrostatic chuck. The cause of this is that the gas introduction pipe 120 and the brazed part 124 contract more largely than the ceramic plate 110 when cooled. Thus, by repeating the thermal cycle only several times, the ceramic plate 110 may crack. This may prevent the air tightness from being maintained and lead to leakage through the gas introduction hole. Furthermore, a metal ring (not illustrated) having a diameter slightly smaller than that of the ceramic plate 110 may be brazed to the rear surface of the ceramic plate 110 in addition to the gas introduction pipe 120. However, also in this joint portion between the ring and the ceramic plate 110, the cracking as described above is caused, and accordingly, the air tightness cannot be maintained.

The present invention is made to address such a problem. A main object of the present invention is to improve durability against a thermal cycle in a structure for joining a ceramic plate to a metal cylindrical member.

A structure for joining according to the present invention joins a ceramic plate to a metal cylindrical member, including:

a flange which is formed at an end of the cylindrical member, an annular bank which is provided at a position of the ceramic plate facing the flange, and a brazed part which is formed in a space between the flange and the bank, wherein the flange has a width of 3 mm or more and a thickness of from 0.5 to 2 mm, an edge of the bank facing an outer edge of the flange is chamfered or rounded.

With this structure for joining, the flange of the cylindrical member is joined to the annular bank of the ceramic plate through the brazed part. Furthermore, the size and thickness of the flange are within appropriate value ranges, and the edge of the bank facing the outer edge of the flange is chamfered or rounded. Thus, stress produced due to the difference in thermal expansion between the cylindrical member and the ceramic plate can be received by a side surface of the bank. Consequently, a stress-resistant structure is obtained. Furthermore, a joining area and a sealing distance are increased. This can suppress cracking in a joint portion even when a joined body having such a structure for joining is repeatedly subjected to a thermal cycle. Accordingly, with the structure for joining as described above, durability against the thermal cycle is improved.

In the structure for joining according to the present invention, it is preferable that the height of the bank be 0.5 mm or more. This further improves the durability against the thermal cycle.

In the structure for joining according to the present invention, it is preferable that the edge of the bank facing the outer edge of the flange be chamfered as designated by C0.3 or more or rounded as designated by R0.3 or more. This further improves the durability against the thermal cycle.

In the structure for joining according to the present invention, it is preferable that the ceramic plate be formed of AlN, the cylindrical member be formed of Kovar, and the brazed part be formed of a brazing filler material including Ag, Cu, and Ti or an Al brazing filler material. With the material formed by mixing the components as described above, an effect of the present invention can be more reliably obtained.

In the structure for joining according to the present invention, the ceramic plate may have a gas introduction hole that is opened toward inside of the annular bank and that penetrates through the ceramic plate in a thickness direction, and the cylindrical member may be a gas introduction pipe through which a gas is supplied to the gas introduction hole. This can prevent the gas supplied through the gas introduction pipe from leaking to the outside of the gas introduction pipe and the gas introduction hole even after the thermal cycle has been performed.

In the structure for joining according to the present invention, the annular bank may be formed along an outer circumferential edge of the ceramic plate, and the cylindrical member may be a support ring that supports the ceramic plate. With this structure, air tightness inside the support ring can be maintained even after the thermal cycle has been performed.

DETAILED DESCRIPTION OF THE INVENTION

Figure 1:
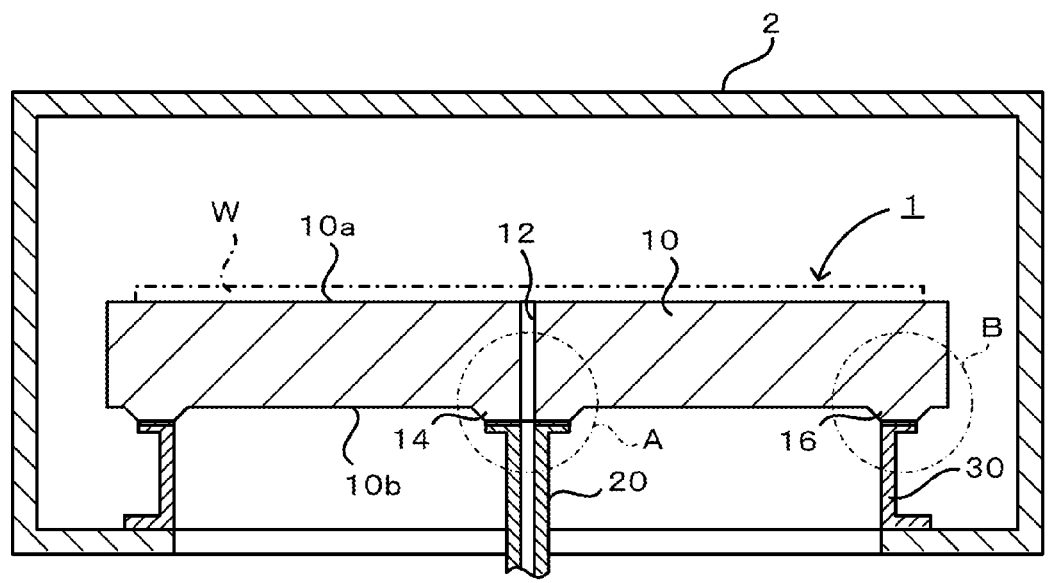
FIG. 1 is a sectional view of an outline of the structure of a member for a semiconductor manufacturing device 1.

A preferred embodiment of the present invention will be described below with reference to the drawings. FIG. 1 is a sectional view of an outline of the structure of a member for a semiconductor manufacturing device 1, FIG. 2 is an enlarged view of part A of FIG. 1, and FIG. 3 is an enlarged view of part B of FIG. 1.

As illustrated in FIG. 1, the member for a semiconductor manufacturing device 1 is provided in a chamber 2. The member for a semiconductor manufacturing device 1 includes a susceptor 10 having a wafer placement surface 10a on which a wafer W is placed, a gas introduction pipe 20 having a small diameter and being joined to a rear surface 10b of the susceptor 10 on the opposite side to the wafer placement surface 10a, and a support ring 30 having a large diameter and being joined to the rear surface 10b, which is the same surface to which the gas introduction pipe 20 is joined. Furthermore, a lower end of the support ring 30 of the member for a semiconductor manufacturing device 1 is joined to an inner surface of the chamber 2 in an air-tight manner.

The susceptor 10 is a discoidal ceramic plate formed of AlN. The susceptor 10 has a gas introduction hole 12 that penetrates through the susceptor 10 in the thickness direction. An annular pipe joining bank 14 is formed on the rear surface 10b side around an opening of the gas introduction hole 12. The pipe joining bank 14 is provided at a position facing a flange 22 of the gas introduction pipe 20. Furthermore, an annular ring joining bank 16 is formed at a position in the susceptor 10 facing a flange 32 of the support ring 30. The ring joining bank 16 is formed along an outer circumferential edge of the susceptor 10 at a position slightly inside the outer circumferential edge.

Figure 2:
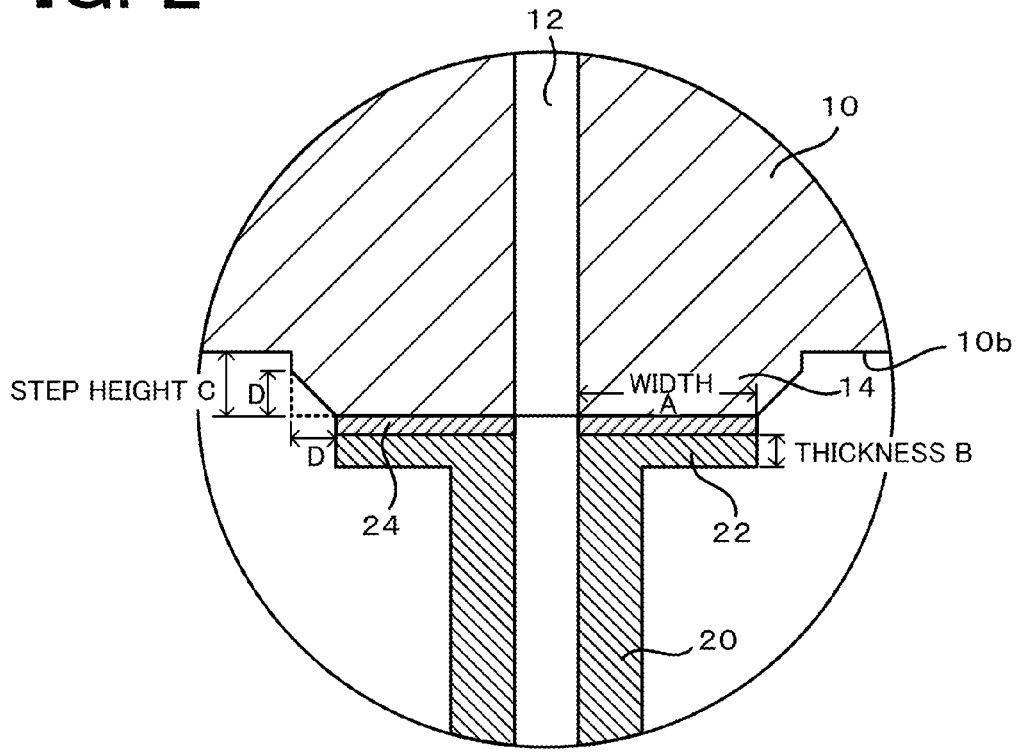
FIG. 2 is an enlarged view of part A of FIG. 1.
Figure 3:
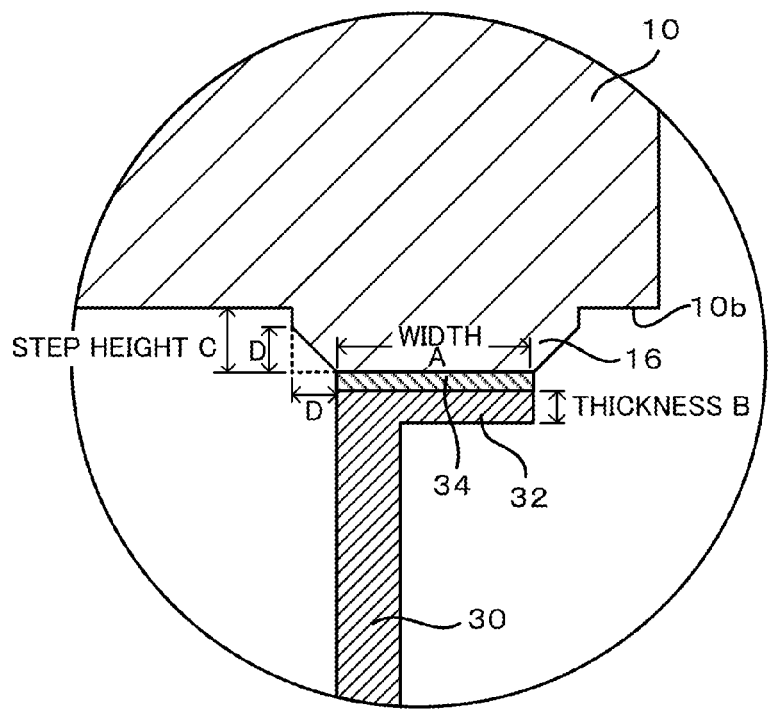
FIG. 3 is an enlarged view of part B of FIG. 1.

The gas introduction pipe 20 is formed of Kovar and, as illustrated in FIG. 2, has the flange 22 at an end thereof joined to the rear surface 10b of the susceptor 10. Kovar has a thermal expansion coefficient substantially equal to that of AlN. For information, the thermal expansion coefficient of AlN is $4.3 \times 10^{-6}/°$ C. (40 to 400° C.), and the thermal expansion coefficient of Kovar is $9 \times 10^{-6}/°$ C. (40 to 400° C.). A pipe brazed part 24 is formed between the flange 22 and the pipe joining bank 14. The pipe brazed part 24 is formed of, for example, an Ag—Cu—Ti brazing filler material or an Al brazing filler material. The thermal expansion coefficient of the Ag—Cu—Ti brazing filler material is, when the Ag—Cu—Ti brazing filler material includes 63% AG by weight, 32.25% Cu by weight, and 1.75% Ti by weight, $18.5 \times 10^{-6}/°$ C. (40 to 400° C.). The thermal expansion coefficient of the Al brazing filler material is $19.5 \times 10^{-6}/°$ C. (40 to 400° C.).

The support ring 30 is formed of Kovar and, as illustrated in FIG. 3, has the flange 32 at an end thereof joined to the rear surface 10b of the susceptor 10. The diameter of the support ring 30 is slightly smaller than the diameter of the susceptor 10. A ring brazed part 34 is formed between the flange 32 and the ring joining bank 16. The ring brazed part 34 is formed of, for example, the Ag—Cu—Ti brazing filler material or the Al brazing filler material.

As illustrated in FIGS. 2 and 3, the flanges 22 and 32 each have a width A of 3 mm or more and a thickness B of from 0.5 to 2 mm. It is not preferable that one or both of the flanges 22 and 32 have the width A of less than 3 mm because air tightness cannot be maintained due to an insufficient sealing distance or an insufficient joining area. It is not preferable that one or both of the flanges 22 and 32 have the thickness B of more than 2 mm because a joint portion cracks due to excessively large stress produced in the joint portion during a thermal cycle. When the amount of this stress is taken into consideration, it is preferable that the thickness of the flanges 22 and 32 be as much reduced as possible. However, the flanges 22 and 32 having a thickness of less than 0.5 mm are not preferred because of a difficulty in manufacturing.

As illustrated in FIGS. 2 and 3, it is preferable that a step height C of the pipe joining bank 14 and the ring joining bank 16 be 0.5 mm or more, and it is preferable that a chamfer or round size D of edges of the pipe joining bank 14 and the ring joining bank 16 facing outer edges of the flanges 22 and 32 be a size as designated by C0.3 or more for chamfering or a size as designated by R0.3 or more for rounding. When these conditions are satisfied, durability against a thermal cycle is sufficiently increased. FIGS. 2 and 3 illustrate an example where edges of the banks 14 and 16 are chamfered.

Despite the above description, even when the step height C of one or both of the banks 14 and 16 is less than 0.5 mm, the durability against the thermal cycle is improved compared to the case where the one of the banks 14 and 16 is not provided or neither of the banks 14 and 16 is provided. Furthermore, even when the chamfer or round size D in one or both of the banks 14 and 16 is less than that designated by C0.3 for chamfering or R0.3 for rounding, the durability against the thermal cycle is improved compared to the case where one of the banks 14 and 16 is not chamfered or rounded or neither of the banks 14 and 16 is chamfered or rounded.

Next, an example of use of the member for a semiconductor manufacturing device 1 having the above-described structure is described. The member for a semiconductor manufacturing device 1 is disposed in the chamber 2 and used to etch a surface of the wafer W by using plasma generated in the chamber 2. At this time, an He gas is supplied according to need to a rear surface of the wafer W thorough the gas introduction pipe 20 and the gas introduction hole 12. This improves a heat uniformity of the wafer W.

Here, the relationships between the elements of the present embodiment and elements of the present invention are clarified. The susceptor 10 according to the present embodiment corresponds to a ceramic plate of the present invention. The gas introduction pipe 20 and the support ring 30 each correspond to a cylindrical member.

The flange 22 of the gas introduction pipe 20 is joined to the pipe joining bank 14 of the susceptor 10 by the pipe brazed part 24, and the flange 22 of the support ring 30 is joined to the ring joining bank 16 of the susceptor 10 by the ring brazed part 34 in the member for a semiconductor manufacturing device 1 according to the present embodiment having been described in detail. Furthermore, the sizes and thicknesses of the flanges 22 and 32 are within appropriate value ranges, and the edges of the banks 14 and 16 facing the outer edges of the flanges 22 and 32 are chamfered or rounded. Thus, stress produced due to the difference in thermal expansion between the support ring 30 and the susceptor 10 can be received by side surfaces of the banks 14 and 16, thereby a stress-resistant structure is obtained. Furthermore, the joining area and the sealing distance are increased. This can suppress cracking in the joint portion even when the member for a semiconductor manufacturing device 1 having the above-described structure for joining is repeatedly subjected to the thermal cycle. Accordingly, with this member for a semiconductor manufacturing device 1, durability against the heat cycle is improved.

Furthermore, the susceptor 10 is formed of AlN, the gas introduction pipe 20 and the support ring 30 are formed of Kovar, and the pipe brazed part 24 and the ring brazed part 34 are formed of the Ag—Cu—Ti brazing filler material or the Al brazing filler material. Thus, the stress produced due to the difference in thermal expansion can be reduced, and accordingly, the durability against the heat cycle can be reliably improved.

Furthermore, the gas supplied through the gas introduction pipe 20 can be prevented from leaking to the outside of the gas introduction pipe 20 and the gas introduction hole 12 after the heat cycle has been performed, and air tightness inside the support ring 30 can be maintained.

In addition, the present invention is not limited at all to the embodiments described above, and of course, it is to be understood that the present invention may be carried out in various modes without departing from the technical scope of the present invention.

For example, instead of the susceptor 10 according to the above-described embodiment, a ceramic plate in which at least one of an electrostatic electrode, a heater electrode, and a plasma generating electrode is embedded may be used.

Figure 4:
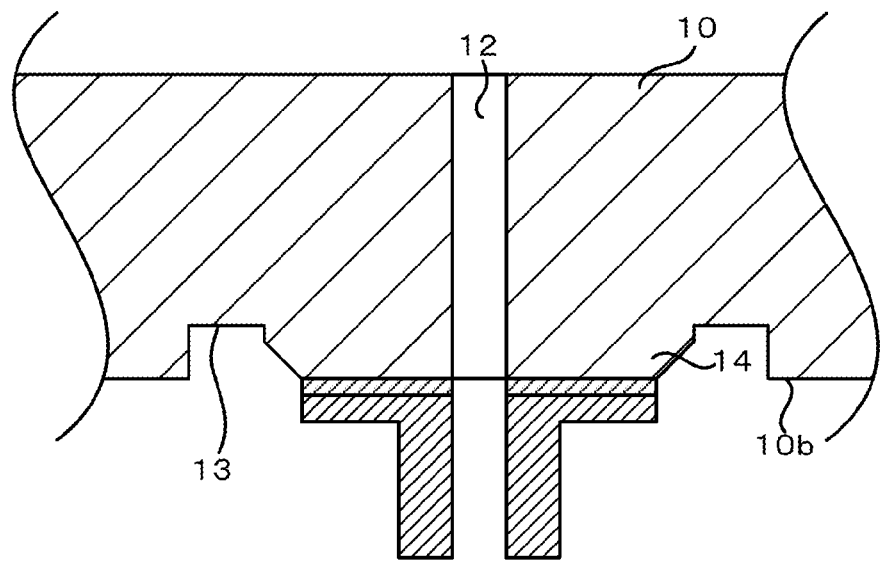
FIG. 4 is an enlarged sectional view of part of another embodiment.

According to the above-described embodiment, the pipe joining bank 14 projects from the rear surface 10b of the susceptor 10. Instead, as illustrated in FIG. 4, the pipe joining bank 14 may be formed by providing a circumferential groove 13 in the rear surface 10b around the opening of the gas introduction hole 12. In this case, the level of the surface at the vertex of the pipe joining bank 14 is the same as that of the rear surface 10b. Effects similar to those obtained with the above-described embodiment can be also obtained with such a structure. Also, the ring joining bank 16 may be formed similarly to the pipe joining bank 14. That is, a circumferential groove having a small diameter and a circumferential groove having a large diameter is provided, and a region between both the circumferential grooves may be defined as the ring joining bank 16.

Although the susceptor 10 is formed of AlN according to the above-described embodiment, the susceptor 10 may be formed of a ceramic other than AlN (for example, alumina or the like). In this case, it is preferable that the materials of the gas introduction pipe 20 and the support ring 30 have a thermal expansion coefficient substantially equal to the material of the susceptor 10 (for example, within plus or minus 10% of the material of the thermal expansion coefficient of the susceptor 10). It is also preferable that the brazing filler materials of the pipe brazed part 24 and the ring brazed part 34 have a thermal expansion coefficient substantially equal to the thermal expansion coefficient of the material of the susceptor 10.

Although the gas introduction pipe 20 and the support ring 30 are each described as an example of a metal cylindrical member according to the above-described embodiment, a different cylindrical member may be joined. For example, a cylindrical member used for insertion of a thermocouple that measures the surface temperature of the susceptor 10 may be joined.

EXAMPLES

[Testing Samples No. 1 to No. 16]

Figure 5:
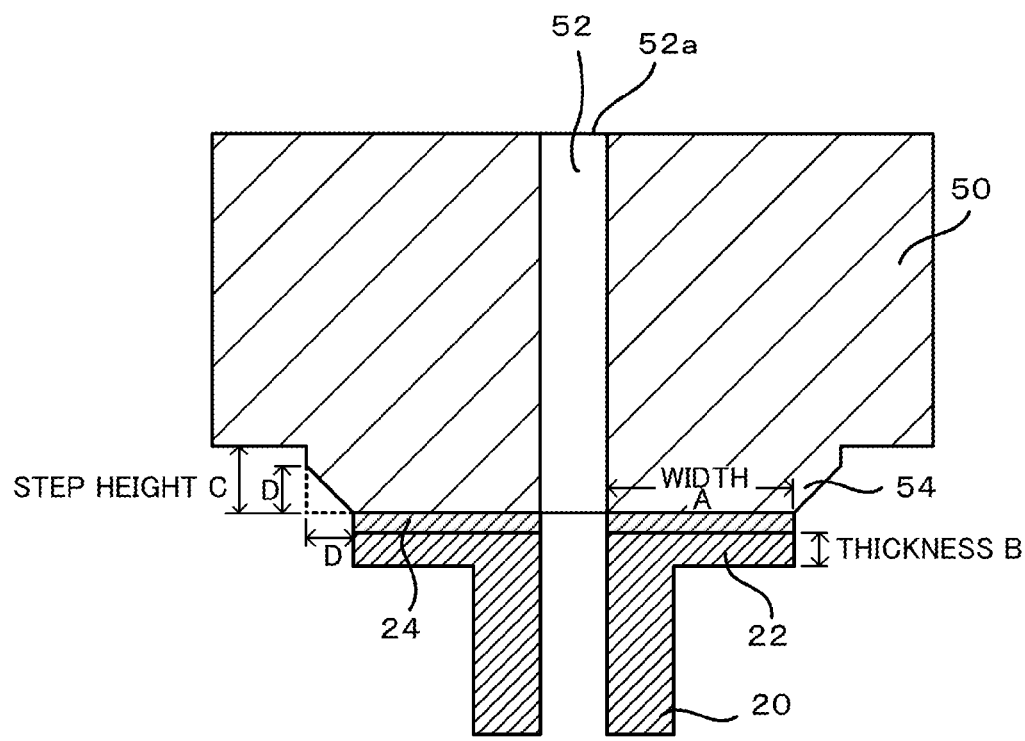
FIG. 5 is a sectional view of a testing sample.

Testing samples illustrated in FIG. 5 were produced. That is, blocks 50 formed of AlN were initially prepared as a model to represent the susceptor 10. The blocks 50 were each provided with a gas introduction hole 52 as a Model to represent the gas introduction hole 12 and a pipe joining bank 54 as a model to represent the pipe joining bank 14. The flange 22 of the gas introduction pipe 20 formed of Kovar was joined to the pipe joining bank 54 through the pipe brazed part 24. Thus, the testing sample was prepared. The Ag—Cu—Ti brazing filler material (63% Ag by weight, 32.25% Cu by weight, and 1.75% Ti by weight) was used as the brazing filler material. The gas introduction pipes 20 that have an inner diameter of about 7.5 mm and an outer diameter of about 9.5 mm were used. As the testing samples, samples No. 1 to No. 16 were produced. Each of the samples No. 1 to No. 16 has the flange width A, the flange thickness B, the step height C of the bank, and the chamfer or round size D as listed in Table 1.

TABLE 1

| Testing Sample No. | Flange Width A [mm] | Flange Thickness B [mm] | Step Height C [mm] | Chamfer or Roud Size D [mm] | Evaluation |
|---|---|---|---|---|---|
| 1 | 1.5 | 0.5 | 1.5 | 1 | NG |
| 2 | 3 | 0.5 | 1.5 | 1 | OK |
| 3 | 5 | 0.5 | 1.5 | 1 | OK |
| 4 | 7 | 0.5 | 1.5 | 1 | OK |
| 5 | 5 | 3 | 1 | 1 | NG |
| 6 | 5 | 2 | 1 | 1 | OK |
| 7 | 5 | 1 | 1 | 1 | OK |
| 8 | 5 | 0.5 | 1 | 1 | OK |
| 9 | 5 | 1 | 0 | 0 | NG |
| 10 | 5 | 1 | 0.5 | 0.3 | OK |
| 11 | 5 | 1 | 1.5 | 1 | OK |
| 12 | 5 | 1 | 3 | 1 | OK |
| 13 | 5 | 1 | 1.5 | 0 | NG |
| 14 | 5 | 1 | 1.5 | 0.3 | OK |
| 15 | 5 | 1 | 1.5 | 1 | OK |
| 16 | 5 | 1 | 1.5 | 1.5 | OK |

[Evaluation]

Each of the samples was subjected to thermal cycle testing. As the thermal cycle testing, a cycle in which the temperature is increased from 150 to 450° C. and then decreased to 150° C. in the atmosphere was repeated 50 times. After the thermal cycle testing had been performed, a sealing property of the joint portion was checked. Also, whether or not a crack was caused was checked through a sectional observation. In order to check the sealing property of the joint, an opening 52a of the gas introduction hole 52 was closed, evacuation was performed through an inlet of the gas introduction pipe 20 using an He leak detector, He was blown from a side surface of the joint portion, and a leakage amount of He was measured. When the leakage amount is less than a threshold (here, $1 \times 10^{-8}$ Pa·m$^3$/sec), the sealing property is determined to be satisfactory. When the leakage amount is equal to or more than the threshold, the sealing property is determined to be unsatisfactory. Furthermore, when the sealing property is satisfactory and no crack is found through the sectional observation, the sample is evaluated as "OK". When the sealing property is unsatisfactory or a crack is found through the sectional observation, the sample is evaluated as "NG". Results are listed in Table 1.

According to the evaluation results of samples No. 1 to No. 4, when the flange width A is 3 mm or more, the sealing property is satisfactory and no crack is observed because the joining area is sufficiently large and the sealing distance is sufficiently long.

According to the evaluation results of samples No. 5 to No. 8, when the flange thickness B is 2 mm or less, the sealing property is satisfactory and no crack is observed because large stress is not produced during the heat cycle testing. It is noted that, when the flange thickness B is less than 0.5 mm, manufacturing of the susceptor 10 is difficult.

According to the evaluation results of samples No. 9 to No. 12, when the step height C of the pipe joining bank is 0.5 mm or more, the sealing property is satisfactory and no crack is observed because the stress produced during the heat cycle testing is reduced.

According to the evaluation results of samples No. 13 to No. 16, when the chamfer or round size D (here, the chamfer size) is 0.3 mm or more (that is, C0.3 or more), the sealing property is satisfactory and no crack is observed because the stress produced during the heat cycle testing is reduced. Also in the case where the edge is rounded instead of chamfered, similar results are obtained.

Figure 7:
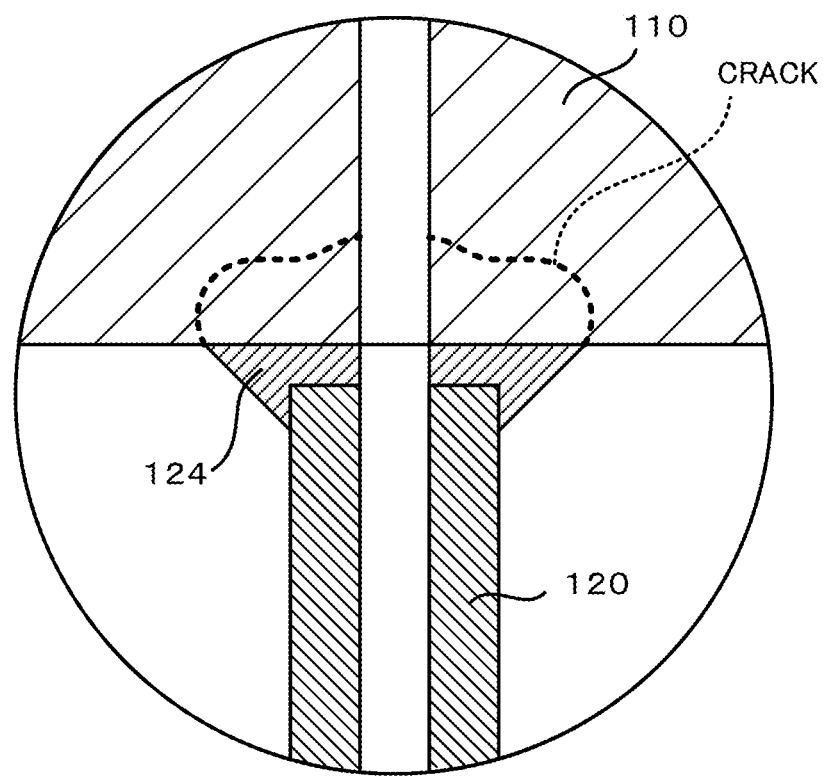
FIG. 7 is a sectional view of a related-art structure for joining.

A different sample was produced in which the block 50 without the pipe joining bank 54 was joined to the gas introduction pipe 20 without the flange 22 so as to form a structure for joining illustrated in FIG. 7 using the above-described Ag—Cu—Ti brazing filler material. This different sample was subjected to the above-described heat cycle testing, and then the sealing property was checked. As a result, the leakage amount exceeded the threshold (unsatisfactory sealing property). Also, when the sectional observation was performed, cracking as indicated by a dotted line in FIG. 7 was found.

[Testing Samples No. 17 to No. 24]

Figure 6:
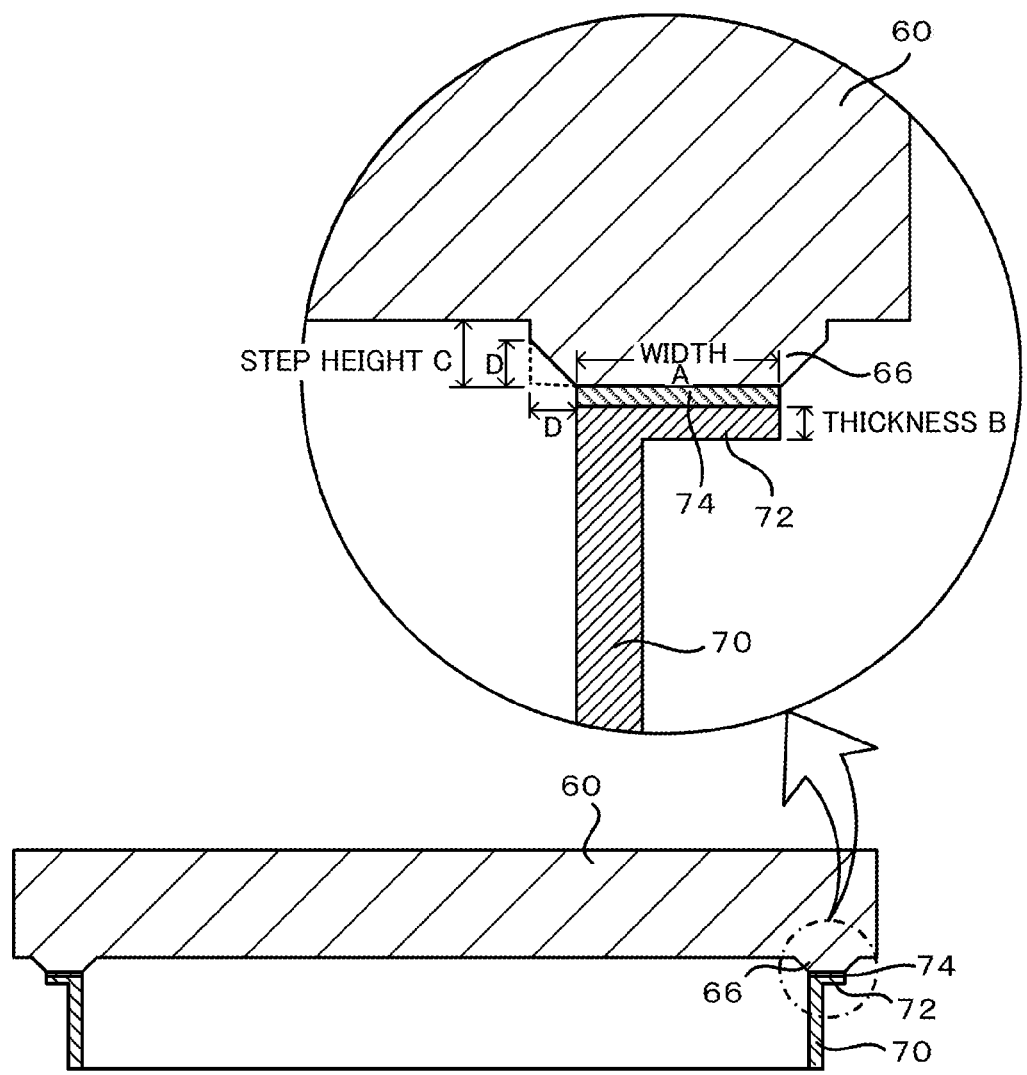
FIG. 6 is a sectional view of a testing sample.

Testing samples illustrated in FIG. 6 were produced. That is, plates 60 formed of AlN as a model to represent the susceptor 10 and rings 70 formed of Kovar as a model to represent the support ring 30 were initially prepared. Each of the plates 60 is provided with a ring joining bank 66 as a model to represent the ring joining bank 16, and each of the rings 70 is provided with a flange 72 as a model to represent the flange 32. The flange 72 of the ring 70 was joined to the ring joining bank 66 through the ring brazed part 74. Thus, the testing sample was produced. The above-described Ag—Cu—Ti brazing filler material was used as the brazing filler material. The ring 70 has an inner diameter of about 228 mm and an outer diameter of about 229.5 mm. As the testing samples, samples No. 17 to No. 24 were produced. Each of the samples No. 17 to No. 24 has the flange width A, the flange thickness B, the step height C of the bank, and the chamfer or round size D as listed in Table 2.

TABLE 2

| Testing Sample No. | Flange Width A [mm] | Flange Thickness B [mm] | Step Height C [mm] | Chamfer or Roud Size D [mm] | Evaluation |
|---|---|---|---|---|---|
| 17 | 1.5 | 0.5 | 1.5 | 1 | NG |
| 18 | 3 | 0.5 | 1.5 | 1 | OK |
| 19 | 5 | 3 | 1.5 | 1 | NG |
| 20 | 5 | 2 | 1.5 | 1 | OK |
| 21 | 5 | 1 | 0 | 0 | NG |
| 22 | 5 | 1 | 0.5 | 0.3 | OK |
| 23 | 5 | 1 | 1.5 | 0 | NG |
| 24 | 5 | 1 | 1.5 | 0.3 | OK |

[Evaluation]

Samples No. 17 to No. 24 were also evaluated similarly to samples No. 1 to No. 16, and results are listed in Table 2. According to the evaluation results of samples No. 17 and No. 18, when the flange width A is 3 mm or more, the sealing property is satisfactory and no crack is observed because the joining area is sufficiently large and the sealing distance is sufficiently long. According to the evaluation results of samples No. 19 and No. 20, when the flange thickness B is 2 mm or less, the sealing property is satisfactory and no crack is observed because large stress is not produced during the heat cycle testing. According to the evaluation results of samples No. 21 and No. 22, when the step height C of the ring joining bank is 0.5 mm or more, the sealing property is satisfactory and no crack is observed because the stress produced during the heat cycle testing is reduced. According to the evaluation results of samples No. 23 and No. 24, when the chamfer or round size D (here, the chamfer size) is 0.3 mm or more (that is, C0.3 or more), the sealing property is satisfactory and no crack is observed because the stress produced during the heat cycle testing is reduced. Also in the case where the edge of the ring joining bank 66 is rounded instead of chamfered, similar results are obtained.

The present application claims priority based on Japanese Patent Application No. 2014-065541 filed in the Japan Patent Office on Mar. 27, 2014, the entire contents of which are incorporated herein by reference.

What is claimed is:

1. A joined body comprising a ceramic plate joined to a metal cylindrical member, the joined body including:
   a flange which is formed at an end of the cylindrical member so as to have an outer edge and a face surface that extends in parallel to a rear surface portion of the ceramic plate,
   an annular bank which is configured to project from the rear surface portion of the ceramic plate such that the bank has an edge that is chamfered or rounded and a face surface that extends in parallel to the rear surface portion, with the face surface of the bank opposing the face surface of the flange, and
   a brazed part which is formed in a space between the opposing face surfaces of the flange and the bank,
   wherein the flange has a width of 3 mm or more and a thickness of from 0.5 to 2 mm, with the edge of the bank that is chamfered or rounded facing the outer edge of the flange.

2. The joined body according to claim 1,
   wherein a height of the bank is 0.5 mm or more.

3. The joined body according to claim 1,
   wherein the edge of the bank facing the outer edge of the flange is chamfered by 0.3 mm or more or rounded by 0.3 mm or more.

4. The joined body according to claim 1,
   wherein the ceramic plate is formed of AlN,
   the cylindrical member is formed of Kovar, and
   the brazed part is formed of a brazing filler material including Ag, Cu, and Ti or an Al brazing filler material.

5. The joined body according to claim 1,
   wherein the ceramic plate has a gas introduction hole that is opened toward inside of the bank and that penetrates through the ceramic plate in a thickness direction, and
   the cylindrical member is a gas introduction pipe through which a gas is supplied to the gas introduction hole.

6. The joined body according to claim 1,
   wherein the bank is formed along an outer circumferential edge of the ceramic plate, and the cylindrical member is a support ring that supports the ceramic plate.

7. The joined body according to claim 1,
wherein a height of the bank is 0.5 mm or more and the edge of the bank facing the outer edge of the flange is chamfered by 0.3 mm or more or rounded by 0.3 mm or more, the ceramic plate is formed of AlN and has a gas introduction hole that is opened toward inside of the bank and that penetrates through the ceramic plate in a thickness direction, the cylindrical member is formed of Kovar and is a gas introduction pipe through which a gas is supplied to the gas introduction hole, and the brazed part is formed of a brazing filler material including Ag, Cu, and Ti or an Al brazing filler material.

8. The joined body according to claim 1,
wherein a height of the bank is 0.5 mm or more, the edge of the bank facing the outer edge of the flange is chamfered by 0.3 mm or more or rounded by 0.3 mm or more, and the bank is formed along an outer circumferential edge of the ceramic plate, the ceramic plate is formed of AlN, the cylindrical member is formed of Kovar and is a support ring that supports the ceramic plate, and the brazed part is formed of a brazing filler material including Ag, Cu, and Ti or an Al brazing filler material.

* * * * *